United States Patent
Zhang

(10) Patent No.: US 9,362,523 B2
(45) Date of Patent: Jun. 7, 2016

(54) ENCAPSULATION STRUCTURE OF OLED DEVICE

(71) Applicant: BOE TECHNOLOGY GROUP CO., LTD., Beijing (CN)

(72) Inventor: Yuxin Zhang, Beijing (CN)

(73) Assignee: BOE TECHNOLOGY GROUP CO, LTD., Beijing (CN)

( * ) Notice: Subject to any disclaimer, the term of this patent is extended or adjusted under 35 U.S.C. 154(b) by 57 days.

(21) Appl. No.: 14/358,794

(22) PCT Filed: Dec. 2, 2013

(86) PCT No.: PCT/CN2013/088268
§ 371 (c)(1),
(2) Date: May 16, 2014

(87) PCT Pub. No.: WO2015/035711
PCT Pub. Date: Mar. 19, 2015

(65) Prior Publication Data
US 2015/0221888 A1  Aug. 6, 2015

(30) Foreign Application Priority Data
Sep. 10, 2013 (CN) .......................... 2013 1 0410007

(51) Int. Cl.
*H01L 23/28* (2006.01)
*H01L 21/00* (2006.01)
(Continued)

(52) U.S. Cl.
CPC ......... *H01L 51/5246* (2013.01); *H01L 51/0097* (2013.01); *H01L 2251/5338* (2013.01)

(58) Field of Classification Search
CPC .............. H01L 21/563; H01L 31/0488; H01L 51/5246; H01L 23/315; H05K 5/065
USPC .......... 257/787–791, 710, 704, 687; 438/112, 438/124–127
See application file for complete search history.

(56) References Cited

U.S. PATENT DOCUMENTS 6,633,121 B2 * 10/2003 Eida .................. H05B 33/10
                                                         313/504
6,933,537 B2    8/2005 Yee et al.
(Continued)

FOREIGN PATENT DOCUMENTS

CN       1427487 A    7/2003
CN       1561551 A    1/2005
(Continued)

OTHER PUBLICATIONS

International Search Report, International Preliminary Report on Patentability and Written Opinion of the International Searching Authority of PCT/CN2013/088268 in Chinese, mailed Jun. 10, 2014.
(Continued)

*Primary Examiner* — Calvin Lee
(74) *Attorney, Agent, or Firm* — Collard & Roe, P.C.

(57) ABSTRACT

An encapsulation structure of OLED device, comprising an upper substrate and a lower substrate that are disposed in opposition to each other. An OLED device is provided on the lower substrate, and an encapsulating thin film is provided on the OLED device. An edge of the lower substrate and an edge of the upper substrate are hermetically coupled through an obstruction wall, and there is a recess at the edge of the lower substrate on the side facing the upper substrate. One end of the obstruction wall that is coupled to the lower substrate is positioned within the recess of the lower substrate, and configured to seal the periphery of the encapsulating thin film within the recess of the lower substrate. With the encapsulation structure, the effect of water vapor and oxygen on the OLED device can be reduced, and service life of the OLED device is prolonged.

20 Claims, 2 Drawing Sheets

(51) Int. Cl.
*H01L 51/52* (2006.01)
*H01L 51/00* (2006.01)

(56) References Cited

U.S. PATENT DOCUMENTS

| | | | |
|---|---|---|---|
| 7,423,375 B2 * | 9/2008 | Guenther | H01L 51/5237 313/506 |
| 2005/0285522 A1 | 12/2005 | Han et al. | |
| 2012/0319141 A1 | 12/2012 | Kim | |

FOREIGN PATENT DOCUMENTS

| CN | 1710999 A | 12/2005 |
|---|---|---|
| CN | 101295768 A | 10/2008 |
| CN | 102709486 A | 10/2012 |
| CN | 203481275 U | 3/2014 |
| JP | 2010-228998 A | 10/2010 |

OTHER PUBLICATIONS

English Translation of the International Search Report of PCT/CN2013/088268 published in English on Mar. 19, 2015.

Chinese Office Action of Chinese Application No. 201310410007.6, mailed Jul. 3, 2015 with English translation.

Second Chinese Office Action of Chinese Application No. 201310410007.6, mailed Feb. 5, 2016 with English translation.

English translation of the International Preliminary Report on Patentability and Written Opinion of the International Searching Authority of PCT/CN2013/088268, issued Mar. 15, 2016.

* cited by examiner

ENCAPSULATION STRUCTURE OF OLED DEVICE

CROSS REFERENCE TO RELATED APPLICATIONS

This application is the National Stage of PCT/CN2013/088268 filed on Dec. 2, 2013, which claims priority under 35 U.S.C. §119 of Chinese Application No. 201310410007.6 filed on Sep. 10, 2013, the disclosure of which is incorporated by reference. The international application under PCT article 21(2) was not published in English.

TECHNICAL FIELD

Embodiments of the present invention relate to an encapsulation structure of an organic light emitting diode (OLED) device.

BACKGROUND

An OLED device refers to such a device that an organic semiconductor material and a luminous material are caused to give off light by injection and recombination of carriers as they are driven by an electric field. OLED devices have more advantages, and hold out broad prospects in the field of display. OLED devices are very sensitive to water vapor and oxygen gas. Water vapor and oxygen gas that permeate into OLED devices are main factors that affect the lifetime of the OLED devices, and therefore OLED devices mostly adopt encapsulation structures for encapsulation so as to serve an obstruction function with respect to oxygen gas and water vapor.

Thin Film Encapsulation (TFE) is an encapsulating mode for OLED devices, and gets a wide attention in the field of flexible OLED devices and in the field of large-size OLED devices in pursuit of lightness and thinness.

An existing thin film encapsulation structure is shown in FIG. 1. An OLED device 02 is produced on a base substrate 01, and the OLED device 02 is covered with an encapsulating thin film 03 comprising at least one layer. The function of the encapsulating thin film 03 is to prevent water vapor and oxygen from entering the OLED device 02 and affecting the OLED device 02.

However, in the thin film encapsulation structure, obstruction with respect to water vapor and oxygen has great demands on property of the materials used for the encapsulating thin film 03. Furthermore, water vapor and oxygen may still leak into the OLED device 02 through a gap between layers of the encapsulating thin film 03 or a gap between the encapsulating thin film 03 and the base substrate 01, or directly seep into the OLED device 02 through layers of the encapsulating thin film 03, and then affect the service life of the OLED device 02.

SUMMARY

According to embodiments of the present invention, there are provided an encapsulation structure of OLED device, for improving encapsulation effect of an OLED device, and prolonging service life of the OLED device.

In an aspect of the invention, there is provided an encapsulation structure of OLED device, comprising an upper substrate and a lower substrate that are disposed in opposition to each other, an OLED device is provided on a side of the lower substrate facing the upper substrate, an encapsulating thin film is provided on the OLED device; an obstruction wall is provided between an edge of the lower substrate and an edge of the upper substrate, the edge of the lower substrate and the edge of the upper substrate are hermetically coupled through the obstruction wall, there is a recess at the edge of the lower substrate on the side facing the upper substrate, one end of the obstruction wall that is coupled to the lower substrate is positioned within the recess of the lower substrate, and configured to seal the periphery of the encapsulating thin film within the recess of the lower substrate.

For example, nitrogen gas, an inert gas, a resin, or a desiccant is filled between the upper substrate and the encapsulating thin film.

For example, the obstruction wall comprises a sealant subjected to UV solidification.

For example, the obstruction wall comprises a glass obstruction wall formed by laser sintering.

For example, the encapsulating thin film includes multiple layers of organic thin film, or multiple layers of inorganic thin film, or multiple layers of organic thin film and inorganic thin film that are laminated alternately.

For example, the organic thin film is an organic thin film formed of polyimide, polyurea, polyamic acid, polyacrylic acid, polyester, polyethylene, or polypropylene; the inorganic thin film is an inorganic thin film formed of $SiO_x$, $SiN_x$, $SiC_xN_y$, $SiO_xN_y$, $AlO_x$, $SnO_2S$, $AlN$, $MgF_2$, $CaF_2$, $In_2O_3$ or ITO.

For example, the upper substrate and the lower substrate are glass substrates or flexible substrates.

For example, a side of the upper substrate facing the lower substrate has a recess corresponding to the recess on the lower substrate, and one end of the obstruction wall coupled to the upper substrate is positioned within the recess of the upper substrate.

For example, on the side of the lower substrate facing the upper substrate, and between the recess of the lower substrate and the OLED device, there is also provided at least one depressed section, and the encapsulating thin film falls into the depressed section to form a zigzag path.

For example, a shape of a cross-section of the recess is an arc, a triangle, a rectangle or a trapezoid; a shape of a cross-section of each of the depressed section is an arc, a triangle, a rectangle or a trapezoid.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Unless otherwise defined, the technical terminology or scientific terminology used herein should have the same meaning as commonly understood by one of ordinary skill in the art to which this invention belongs. Likewise, a term "a," "an," or "the" does not indicate limitation in number, but specifies the presence of at least one. A term "comprises," "comprising," "includes," "including", or the like means that an element or article ahead of this term encompasses element(s) or article(s) listed behind this term and its(their) equivalents, but does not preclude the presence of other elements or articles. "On," "under," "left," "right" or the like is only used to describe a relative positional relationship, and when the absolute position of a described object is changed, the relative positional relationship might also be changed accordingly.

Figure 1:
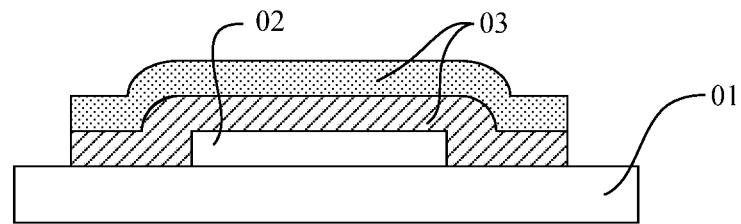
FIG. 1 is a structurally schematic view illustrating a conventional thin film encapsulation structure of an OLED device.
Figure 2:
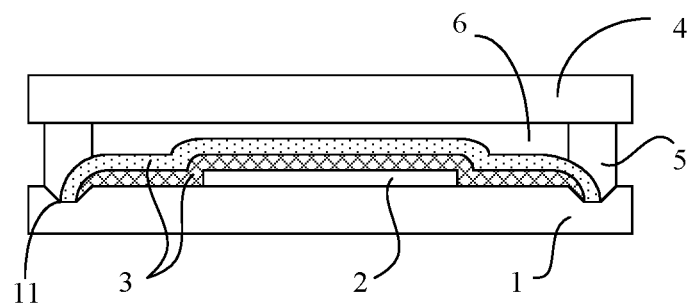
FIG. 2 is a structurally schematic view illustrating a first encapsulation structure for OLED device provided by an embodiment of the invention.

Please referring to FIG. 2, an encapsulation structure of an OLED device provided by an embodiment of the invention includes an upper substrate 4 and a lower substrate 1 that are disposed in opposition to each other, an OLED device 2 is provided on the side of the lower substrate 1 facing the upper substrate 4, and an encapsulating thin film 3 is provided on the OLED device 2. Between the edge of the lower substrate 1 and the edge of the upper substrate 4, there is provided an obstruction wall 5, which can serve to attach the upper substrate 4 and the lower substrate 1 together and can serve a function of sealing. There is a recess 11 at the edge of the lower substrate 1 on the side facing the upper substrate 4, and one end of the obstruction wall 5 that is coupled to the lower substrate 1 is positioned within the recess 11 of the lower substrate 1, and acts to seal the periphery of the encapsulating thin film 3 within the recess 11 of the lower substrate 1.

With the aid of the encapsulation structure of the OLED device 2 as stated above, upon the OLED device 2 being encapsulated, the encapsulating thin film 3 is disposed on the OLED device 2 on the lower substrate 1, and the periphery of the encapsulating thin film 3 is positioned within the recess 11 disposed at the edge of the lower substrate 1. Next, the obstruction wall 5 is formed within the recess 11 so as to seal the periphery of the encapsulating thin film 3 within the recess 11, and in turn, external water vapor and oxygen are prevented from entering the OLED device 2 through a gap between the encapsulating thin film 3 and the lower substrate 1 and adversely affecting the OLED device 2. If the encapsulating thin film 3 has a plurality of thin film layer, the obstruction wall 5 will act to seal the overlap portions between the thin film layers on their periphery within the recess 11, so that water vapor and oxygen are prevented from entering the OLED device 2 through a gap between the layers of thin film and adversely affecting the OLED device 2. Furthermore, the periphery of the upper substrate 4 and the periphery of the lower substrate 1 are hermetically coupled with the aid of the obstruction wall 5, so that external water vapor and oxygen can be obstructed from contacting with the encapsulating thin film 3 by the upper substrate 4. Thus, the amount of water vapor and oxygen that permeate into the OLED device 2 via the encapsulating thin film 3 is decreased, and the effect of water vapor and oxygen on the OLED device 2 is reduced, and serve life of the OLED device 2 is prolonged.

So, the encapsulation structure of OLED device provided by the embodiment of the invention has a better encapsulating effect on the OLED device, and it can improve service life of the OLED device.

As shown in FIG. 2, a cavity 6 is formed between the upper substrate 4, the encapsulating thin film 3 and the obstruction wall 5, and preferably, for the sake of further decreasing the amount of water vapor and oxygen that permeate into the OLED device 2 via the encapsulating thin film 3, the cavity 6 between the upper substrate 4 and the encapsulating thin film 3 can be filled with nitrogen gas, an inert gas, a resin, a desiccant, or the like. After the cavity 6 between the upper substrate 4 and the encapsulating thin film 3 is filled with nitrogen gas, the inert gas or the resin, the encapsulating thin film 2 exists in an condition without oxygen; in turn, water vapor and oxygen contacting the encapsulating thin film 3 are decreased to a further degree, and the amount of water vapor and oxygen that permeate into the OLED device 2 via the encapsulating thin film 3 is decreased. After the cavity 6 between the upper substrate 4 and the encapsulating thin film 3 is filled with desiccant, water vapor and oxygen that permeate into the OLED device 2 via the encapsulating thin film 3 can be decreased.

In a preferable example, the obstruction wall between the upper substrate 4 and the lower substrate 1 may comprise a sealant subjected to ultraviolet (UV) solidification.

In another preferable example, the obstruction wall between the upper substrate 4 and the lower substrate 1 may also comprise a glass obstruction wall formed by laser sintering.

In embodiments of the invention, the encapsulating thin film 3 may have a variety of choices, and it may be one layer of thin film or be formed by laminating multiple thin film layers. When the encapsulating thin film 3 is a thin film formed by laminating multiple thin film layers, the encapsulating thin film 3 may be a thin film formed by laminating multiple layers of organic thin film, or may also be a thin film formed by laminating multiple layers of inorganic thin film, or may also be multiple layers of organic thin film and inorganic thin film that are laminated alternately.

Preferably, the organic thin film in the encapsulating thin film 3 may be an organic thin film formed of polyimide, polyurea, polyamic acid, polyacrylic acid, polyester, polyethylene, or polypropylene.

The inorganic thin film in the encapsulating thin film 3 may be an inorganic thin film formed of $SiOx$, $SiNx$, $SiCxNy$, $SiOxNy$, $AlOx$, $SnO_2$, $AlN$, $MgF_2$, $CaF_2$, $In_2O_3$ or ITO.

In embodiments of the invention, substances for the upper substrate 4 and the lower substrate 1 may have a variety of selections. For example, each of the upper substrate 4 and the lower substrate 1 may be a glass substrate or a flexible substrate, so as to comply with the demands for lightness and thinness in the field of large-size OLED devices or in the field of flexible OLED devices.

Figure 3:
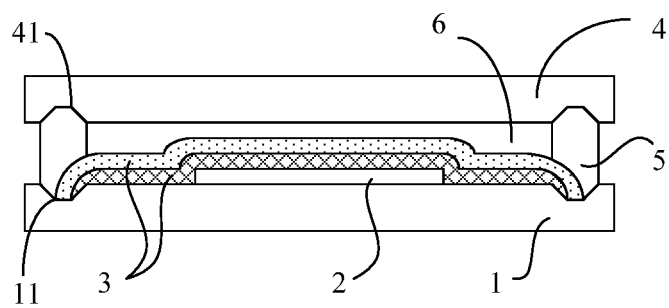
FIG. 3 is a structurally schematic view illustrating a second encapsulation structure for OLED device provided by an embodiment of the invention.

Please referring to FIG. 3, preferably, in another embodiment, for the sake of increasing the strength of coupling between the obstruction wall 5 and the upper substrate 4, the side of the upper substrate 4 facing the lower substrate 1 may also have a recess 41 corresponding to the recess 11 on the lower substrate 1. One end of the obstruction wall 5 coupled to the upper substrate 4 is positioned within the recess 41 of the upper substrate 4.

In the event that one end of the obstruction wall 5 coupled to the upper substrate 4 is positioned within the recess 41 of the upper substrate 4, the contact area between the obstruction wall 5 and the upper substrate 4 can be enlarged, and then the cohesive force between the obstruction wall 5 and the upper substrate 4 is increased. In turn, the strength of coupling between the obstruction wall 5 and the upper substrate 4 is magnified.

Figure 4:
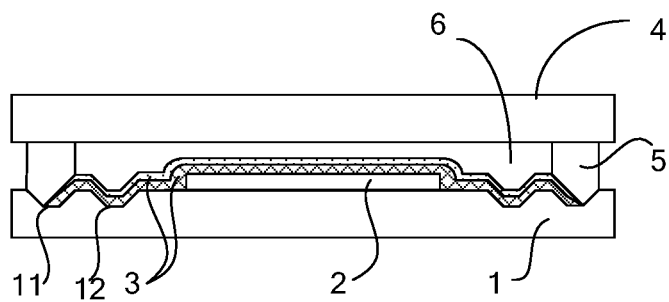
FIG. 4 is a structurally schematic view illustrating a third encapsulation structure for OLED device provided by an embodiment of the invention.

Please referring to FIG. 4, in an embodiment, on the side of the lower substrate 1 facing the upper substrate 4, and between the recess 11 of the lower substrate 1 and the OLED device 2, there is also provided at least one depressed section 12. The encapsulating thin film 3 falls into the depressed section 12 to form a zigzag path, and this enlarges the distance between the periphery of the encapsulating thin film 3 and the OLED device 2, and increases the path along which water vapor and oxygen enter the encapsulating thin film 3 and the OLED device 2 through a gap between the encapsulating thin film 3 and the lower substrate 1 and a gap between the layers of thin film contained in the encapsulating thin film 3. Thereby, the time by which water vapor and oxygen enter the OLED device is delayed further, and service life of the OLED device 2 is improved.

Figure 5A:
FIG. 5a to FIG. 5f are schematic view illustrating the shape of a recess and a depressed section that are disposed on a lower substrate in an encapsulation structure for OLED device provided by an embodiment of the invention.
Figure 5B:
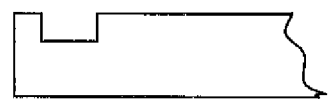
Figure 5C:
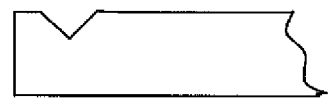

In embodiments of the invention, a cross-section of the recess 11 on the lower substrate 1 can take on a variety of shapes. For example, as shown in FIG. 5a, the shape of the cross-section of the recess 11 on the lower substrate 1 may be an arc; as shown in FIG. 5b, the shape of the cross-section of the recess 11 on the lower substrate 1 may be a rectangle; as shown in FIG. 5c, the shape of the cross-section of the recess 11 on the lower substrate 1 may be a triangle; and the shape of the cross-section of the recess 11 on the lower substrate 1 may be a trapezoid as well.

Certainly, the recess 11 on the lower substrate 1 may also be of other shapes, as long as sealing the periphery of the encapsulating thin film 3 within the recess 11 with the obstruction wall 5 can be realized, for which more description is omitted here.

Figure 5D:
Figure 5E:
Figure 5F:
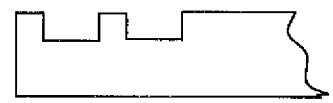

Likewise, in embodiments of the invention, a cross-section of the depressed section 12 on the lower substrate 1 may take on a variety of shapes. As shown in FIG. 5d, FIG. 5e and FIG. 5f, for the convenience of production of the lower substrate 1, the shape of a cross-section of each depressed section 12 on the lower substrate 1 may be the same as, or may also be different from the shape of a cross-section of the recess 11 in the lower substrate 1, for example, it may be an arc, a triangle, a rectangle or a trapezoid. Furthermore, a plurality of depressed sections may also be provided on the lower substrate 1, so as to increase the zigzag path along which water vapor and oxygen travel.

Of course, the recess 41 on the upper substrate 4 may also be in the shape of an arc, a triangle, a rectangle, or a trapezoid, and details thereof are omitted here.

Descriptions made above are merely exemplary embodiments of the invention, but are not used to limit the protection scope of the invention. The protection scope of the invention is determined by attached claims.

The invention claimed is:

1. An encapsulation structure of OLED device, comprising: an upper substrate and a lower substrate that are disposed in opposition to each other, wherein an OLED device is provided on a side of the lower substrate facing the upper substrate, an encapsulating thin film is provided on the OLED device;

an obstruction wall is provided between an edge of the lower substrate and an edge of the upper substrate, the edge of the lower substrate and the edge of the upper substrate are hermetically coupled through the obstruction wall, there is a recess at the edge of the lower substrate on the side facing the upper substrate, one end of the obstruction wall that is coupled to the lower substrate is positioned within the recess of the lower substrate, and configured to seal a periphery of the encapsulating thin film within the recess of the lower substrate;

wherein on the side of the lower substrate facing the upper substrate, and between the recess of the lower substrate and the OLED device, there is also provided at least one depressed section, and the encapsulating thin film falls into the depressed section to form a zigzag path.

2. The encapsulation structure claimed as claim 1, wherein a shape of a cross-section of the recess is an arc, a triangle, a rectangle or a trapezoid;

a shape of a cross-section of each of the depressed section is an arc, a triangle, a rectangle or a trapezoid.

3. An encapsulation structure of OLED device, comprising: an upper substrate and a lower substrate that are disposed in opposition to each other, wherein an OLED device is provided on a side of the lower substrate facing the upper substrate, an encapsulating thin film is provided on the OLED device;

an obstruction wall is provided between an edge of the lower substrate and an edge of the upper substrate, the edge of the lower substrate and the edge of the upper substrate are hermetically coupled through the obstruction wall, there is a recess at the edge of the lower substrate on the side facing the upper substrate, one end of the obstruction wall that is coupled to the lower substrate is positioned within the recess of the lower substrate, and configured to seal a periphery of the encapsulating thin film within the recess of the lower substrate; and the encapsulating thin film extends from above the OLED device into the recess, the encapsulating thin film is at least partially overlapped with the obstruction wall, and the periphery of the encapsulating thin film is sealed within the recess of the lower substrate by the obstruction wall.

4. The encapsulation structure claimed as claim 3, wherein the obstruction wall comprises a sealant subjected to UV solidification.

5. The encapsulation structure claimed as claim 3, wherein the obstruction wall comprises a glass obstruction wall formed by laser sintering.

6. The encapsulation structure claimed as claim 3, wherein the upper substrate and the lower substrate are glass substrates or flexible substrates.

7. The encapsulation structure claimed as claim 3, wherein a side of the upper substrate facing the lower substrate has a recess corresponding to the recess on the lower substrate, and one end of the obstruction wall coupled to the upper substrate is positioned within the recess of the upper substrate.

8. The encapsulation structure claimed as claim 3, wherein the encapsulating thin film includes layers of organic thin film, or layers of inorganic thin film, or multiple layers of organic thin film and inorganic thin film that are laminated alternately.

9. The encapsulation structure claimed as claim 8, wherein the organic thin film is an organic thin film formed of polyimide, polyurea, polyamic acid, polyacrylic acid, polyester, polyethylene, or polypropylene;

the inorganic thin film is an inorganic thin film formed of SiOx, SiNx, SiCxNy, SiOxNy, AlOx, $SnO_2$, AlN, $MgF_2$, $CaF_2$, $In_2O_3$ or ITO.

10. The encapsulation structure claimed as claim 8, wherein a side of the upper substrate facing the lower substrate has a recess corresponding to the recess on the lower substrate, and one end of the obstruction wall coupled to the upper substrate is positioned within the recess of the upper substrate.

11. The encapsulation structure claimed as claim 8, wherein on the side of the lower substrate facing the upper substrate, and between the recess of the lower substrate and the OLED device, there is also provided at least one depressed section, and the encapsulating thin film falls into the depressed section to form a zigzag path.

12. The encapsulation structure claimed as claim 11, wherein a shape of a cross-section of the recess is an arc, a triangle, a rectangle or a trapezoid;
a shape of a cross-section of each of the depressed section is an arc, a triangle, a rectangle or a trapezoid.

13. The encapsulation structure claimed as claim 3, wherein nitrogen gas, an inert gas, a resin, or a desiccant is filled between the upper substrate and the encapsulating thin film.

14. The encapsulation structure claimed as claim 13, wherein the obstruction wall comprises a sealant subjected to UV solidification.

15. The encapsulation structure claimed as claim 13, wherein the obstruction wall comprises a glass obstruction wall formed by laser sintering.

16. The encapsulation structure claimed as claim 13, wherein a side of the upper substrate facing the lower substrate has a recess corresponding to the recess on the lower substrate, and one end of the obstruction wall coupled to the upper substrate is positioned within the recess of the upper substrate.

17. The encapsulation structure claimed as claim 13, wherein the encapsulating thin film includes layers of organic thin film, or layers of inorganic thin film, or multiple layers of organic thin film and inorganic thin film that are laminated alternately.

18. The encapsulation structure claimed as claim 17, wherein the organic thin film is an organic thin film formed of polyimide, polyurea, polyamic acid, polyacrylic acid, polyester, polyethylene, or polypropylene;
the inorganic thin film is an inorganic thin film formed of SiOx, SiNx, SiCxNy, SiOxNy, AlOx, $SnO_2$, AlN, $MgF_2$, $CaF_2$, $In_2O_3$ or ITO.

19. The encapsulation structure claimed as claim 13, wherein on the side of the lower substrate facing the upper substrate, and between the recess of the lower substrate and the OLED device, there is also provided at least one depressed section, and the encapsulating thin film falls into the depressed section to form a zigzag path.

20. The encapsulation structure claimed as claim 19, wherein a shape of a cross-section of the recess is an arc, a triangle, a rectangle or a trapezoid;
a shape of a cross-section of each of the depressed section is an arc, a triangle, a rectangle or a trapezoid.

* * * * *